United States Patent
Mueller et al.

(10) Patent No.: US 8,492,240 B2
(45) Date of Patent: Jul. 23, 2013

(54) SOLAR-CELL MARKING METHOD AND SOLAR CELL

(75) Inventors: Joerg Mueller, Sandersdorf (DE); Toralf Patzlaff, Halle (DE)

(73) Assignee: Hanwha Q.CELLS GmbH, Bitterfeld-Wolfen OT Thalheim (DE)

( * ) Notice: Subject to any disclaimer, the term of this patent is extended or adjusted under 35 U.S.C. 154(b) by 601 days.

(21) Appl. No.: 12/224,403

(22) PCT Filed: Feb. 28, 2007

(86) PCT No.: PCT/EP2007/051925
§ 371 (c)(1),
(2), (4) Date: Aug. 26, 2008

(87) PCT Pub. No.: WO2007/099138
PCT Pub. Date: Sep. 7, 2007

(65) Prior Publication Data
US 2009/0050198 A1 Feb. 26, 2009

(30) Foreign Application Priority Data
Feb. 28, 2006 (DE) .......................... 10 2006 009 584

(51) Int. Cl.
*H01L 21/76* (2006.01)
(52) U.S. Cl.
USPC ............. 438/401; 257/797; 257/E23.179; 257/53; 438/462
(58) Field of Classification Search
USPC .............. 257/53, 797, E23.179; 438/401, 438/462
See application file for complete search history.

(56) References Cited

U.S. PATENT DOCUMENTS

| 4,336,648 | A | * | 6/1982 | Pschunder et al. ............. 438/64 |
| 4,568,409 | A | | 2/1986 | Caplan |
| 4,626,613 | A | | 12/1986 | Wenham et al. |

(Continued)

FOREIGN PATENT DOCUMENTS

| DE | 38 15 512 | 11/1989 |
| DE | 38 78 381 | 6/1993 |

(Continued)

OTHER PUBLICATIONS

International Search Report.

(Continued)

*Primary Examiner* — Jarrett Stark
(74) *Attorney, Agent, or Firm* — Collard & Roe, P.C.

(57) ABSTRACT

The invention relates to a solar-cell marking method comprising the steps of: providing a substrate with a substrate surface for producing a solar cell (1) that comprises an active zone (5); and producing at least one indentation (21, 31) in the substrate surface with the use of laser irradiation, wherein the at least one indentation (21, 31) forms a marking (2, 3) for marking the solar cell (1), and producing the indentation (21, 31) is carried out prior to carrying out a solar-cell manufacturing process or during carrying out a solar-cell manufacturing process. According to the invention the substrate is designed as a semiconductor wafer with a wafer surface, and the marking (2, 3) is positioned on the wafer surface such that the marking (2, 3) is in the active zone (5) of the solar cell (1) formed by the semiconductor wafer. Furthermore, the invention relates to a semiconductor-wafer solar cell (1) whose marking is easily recognizable and thus positioned so as to be reliably readable, without this impeding the functionality of the solar cell (1).

27 Claims, 3 Drawing Sheets

U.S. PATENT DOCUMENTS

Figure 1:
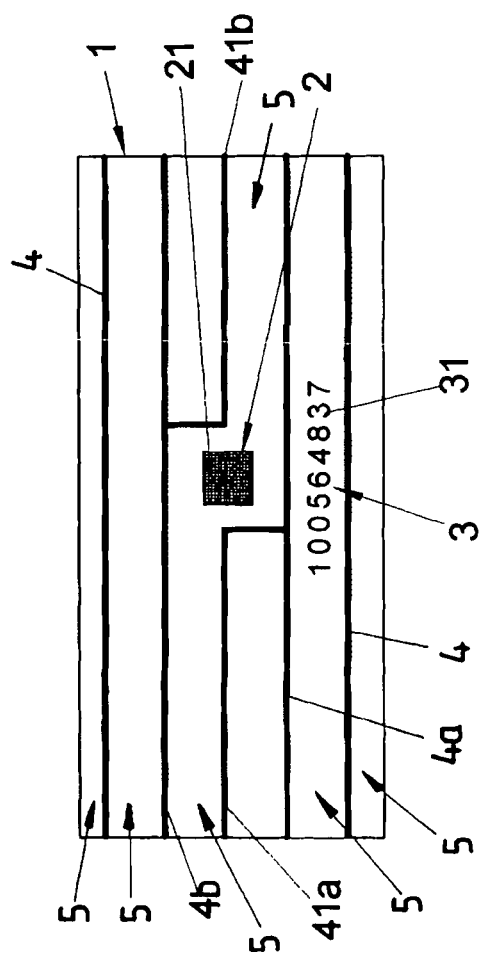

| | | | |
|---|---|---|---|
| 4,896,034 | A | 1/1990 | Kiriseko |
| 5,256,578 | A | 10/1993 | Corley et al. |
| 5,374,564 | A | 12/1994 | Bruel |
| 5,610,104 | A | 3/1997 | Mitchell |
| 5,782,994 | A * | 7/1998 | Mori et al. ............ 136/251 |
| 6,004,405 | A | 12/1999 | Oishi et al. |
| 6,112,738 | A | 9/2000 | Witte et al. |
| 6,235,637 | B1 * | 5/2001 | Chen et al. ............ 438/694 |
| 6,303,899 | B1 | 10/2001 | Johnson et al. |
| 6,489,216 | B1 * | 12/2002 | Shiu et al. ............ 438/401 |
| 6,578,764 | B1 | 6/2003 | Hiraishi et al. |
| 6,954,002 | B2 | 10/2005 | Zaidi et al. |
| 7,007,855 | B1 | 3/2006 | Barker et al. |
| 7,510,124 | B2 | 3/2009 | Barker et al. |
| 2003/0049881 | A1 | 3/2003 | Takada et al. |
| 2004/0041283 | A1 * | 3/2004 | Zaidi et al. ............ 257/797 |
| 2004/0110313 | A1 | 6/2004 | Matsunami |
| 2004/0166444 | A1 | 8/2004 | Kiso |
| 2005/0042780 | A1 | 2/2005 | Matsunami |
| 2006/0065985 | A1 * | 3/2006 | Berman et al. ........ 257/797 |
| 2007/0163634 | A1 * | 7/2007 | Wada et al. ............ 136/252 |

FOREIGN PATENT DOCUMENTS

| | | |
|---|---|---|
| DE | 199 33 703 | 10/2000 |
| DE | 10 2004 021 259 | 11/2005 |
| EP | 0 311 087 | 4/1989 |
| EP | 0 334 330 | 9/1989 |
| EP | 1 089 346 | 4/2001 |
| EP | 1 115 153 | 7/2001 |
| EP | 1 427 014 | 6/2004 |
| JP | 2001-313238 | 11/2001 |
| KR | 10-2004-0100207 | 12/2004 |
| KR | 10-2005-0045047 | 5/2005 |

OTHER PUBLICATIONS

Wenski G. et al., "Mehr Chemie als man glaubt—Die Herstellung von Reinstsiliciumscheiben," Chem. Unserer Zeit, 2003, 37, pp. 198-208. (With English translation of pp. 198, 199, 201, 202, and 203).

Semi M12-1103, "Specification for Serial Alphanumeric Marking of the Front Surface of Wafers," 1988, 2003, pp. 1-10.

Semi M13-1103, "Specification for Alphanumeric Marking of Silicon Wafers," 1988, 2003, pp. 1-13.

Kleinwechter, A. et al., "Mass Production of Large-Size GaAs Wafers at Freiberger," Freiberger Compound Materials GmbH, GaAs MANTECH Inc., International Conference on Compound Semiconductor Manufacturing Technology, 2001, pp. 1-4.

Green, M. A. et al., "Improvements in Silicon Solar Cell Efficiency," Solar Cells, 17 (1986), pp. 75-83.

InnoLas Semiconductor, IL 2000 Wafer Marking System. (With partial English translation).

Wenski G. et al., "Mehr Chemie als man glaubt—Die Herstellung von Reinstsiliciumscheiben," Chem. Unserer Zeit, 2003, 37, pp. 198-208.

Letter dated Feb. 28, 2011 and Annexes from counsel for SOLARWORLD AG.

Neuhaus and Münzer, "Industrial Silicon Wafers Solar Cells," (Review Article) Advances in Optoelectronics, vol. 2007, Article ID 24521, 15 pages.

Extracts from the dictionary: "Lexikon Elektronik und Mikroelektronik" VDI Verlag, $2^{nd}$ updated and extended edition, 1993 (title page, publication page and pp. 14, 191-193, 406, 433 and 973-974).

Final report "SOLPRO V," published on Aug. 31, 2006, Fraunhofer IPT, Fraunhofer ISE, Schlussbericht SOLPRO V, pp. 1-2 and 5-112.

Extract from the journal "Photanik" Apr. 2005, p. 54. (With partial English translation).

Semi T2-0298 (Reapproved 1104) Specification for Marking of Wafers with a Two-Dimensional Matrix Code Symbol, Semi 1993, 2004, pp. 1-9.

Letter dated May 9, 2011 with Analysis of References from McGlew and Tuttle, P.C.

* cited by examiner

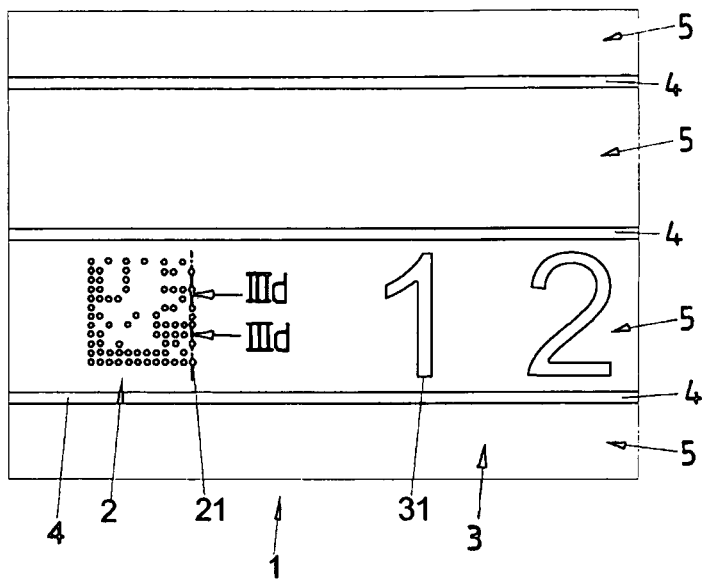
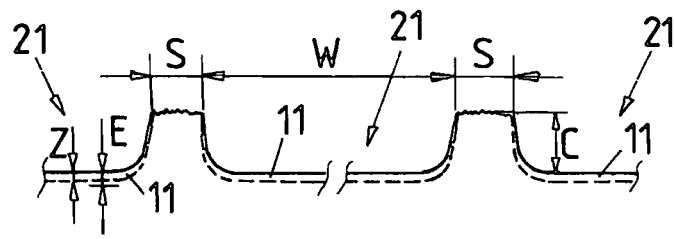
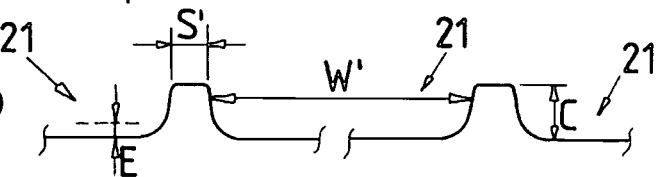
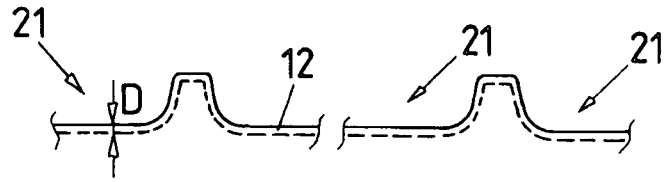
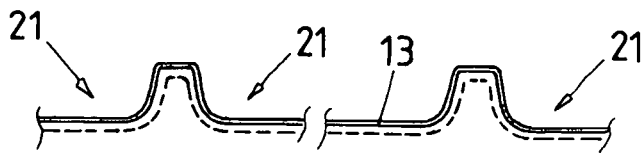

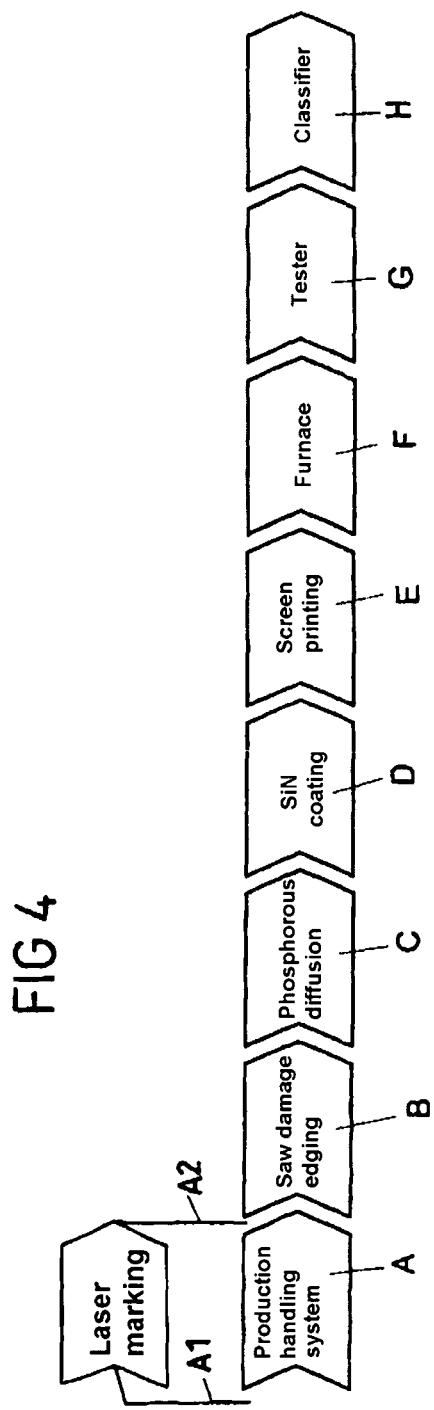

SOLAR-CELL MARKING METHOD AND SOLAR CELL

CROSS REFERENCE TO RELATED APPLICATIONS

This application is the National Stage of PCT/EP2007/051925 filed on Feb. 28, 2007, which claims priority under 35 U.S.C. §119 of German Application No. 10 2006 009 584.7 filed on Feb. 28, 2006. The international application under PCT article 21(2) was not published in English.

The invention relates to a solar-cell marking method according to the precharacterising part of claim 1, and to a solar cell according to the precharacterising part of claim 17.

From EP 1 089 346 A2 a solar-cell marking method is known in which first a substrate with a substrate surface for producing a solar cell is provided, which solar cell comprises an active zone, and subsequently at least one indentation is produced in the substrate surface with the use of laser irradiation. The at least one indentation forms a marking for marking the solar cell, and producing the indentation is carried out prior to carrying out a solar-cell manufacturing method or during carrying out a solar-cell manufacturing method. This solar-cell marking method is, however, optimised for the use of so-called thin-film solar modules. The thin-film solar modules comprise a multitude of thin-film solar cells that are monolithically connected in series. These thin-film solar cells are deposited on a substrate designed as a glass pane. To prevent the marking that has been engraved by means of laser irradiation from impeding proper functioning of the thin-film solar cells, the marking is positioned in the margin region of the glass pane, which margin region does not contribute to the electricity generation of the solar module.

However, since the margin regions do not contribute to the electricity generation of the solar cells, it is desirable for these margin regions to be designed so as to be as small as possible.

It is the object of the present invention to create a simple solar-cell marking method that makes it possible to minimise the margin regions of the solar cell, which margin regions do not contribute to power generation.

This object is met by a solar-cell marking method with the characteristics of claim 1.

The invention provides for the substrate to be designed as a semiconductor wafer with a wafer surface, and for the marking to be positioned on the wafer surface such that the marking is situated in the active zone of the solar cell formed by the semiconductor wafer.

Because the semiconductor wafer is used as a substrate, the active zone of the solar cell, which active zone is produced on the substrate surface, can be maximised until just in front of the margin of the substrate. The method related steps in the production of semiconductor-wafer solar cells, which method related steps differ when compared to those of thin-film solar modules, make it possible to position a marking in the active zone of the solar cell, wherein the marking is produced in the form of at least one indentation made in the wafer surface, which indentation has been produced by means of laser irradiation.

Depending on the process stage at which the marking has been produced in the wafer surface during production of the semiconductor-wafer solar cells, the manufacturing process can be traced back to different stages by reading the marking.

Polycrystalline or monocrystalline material can be considered as a semiconductor wafer, in particular of course silicon, but also germanium and other semiconductor materials known in the production of wafers. Likewise it is also imaginable to use a semiconductor wafer that has been manufactured by means of a string-ribbon method.

Reading out the markings is preferably undertaken at the end of the solar-cell manufacturing process; however, it is also possible between individual partial steps during processing. In further processing of the solar cells, for example for the manufacture of a solar module, the same option exists. The active zones of the solar cells that are arranged in solar modules are oriented such that they are reached as well as possible by the incident light. This ensures as a side effect that the markings of the solar cells in each solar module with reading devices that operate with optical image producers are easy to read out. In this way long-term tracking of the solar cells in solar modules is possible over the entire product life.

The method relates both to the case where on a semiconductor wafer only a single solar cell is produced, and to the case where on a semiconductor wafer a multitude of solar cells are produced. In the case of a multitude of solar cells, one or several markings can be produced.

Preferably, the at least one indentation is produced at such a depth that as a result of the marking formed it is readable by means of an opto-electronic reading device even after the entire manufacturing process has been completed. In this way the entire manufacturing process of a semiconductor-wafer solar cell can be tracked with one and the same indentation. The process steps during manufacture can both apply material to the wafer surface, for example as a deposit of layers, and remove material from the wafer surface, for example in the form of etching processes. Depending on the thickness (layer thicknesses during depositing and etching) and on the isotropy of the material change, and taking into account the requirement of the reading device being used, the depth of the indentations is formed.

A particularly advantageous variant of the method is characterised in that after producing the at least one indentation an etching step is provided such that the zones influenced by heat at the wafer surface are completely removed in the region of the indentation. In the production of the indentations the microstructure of the semiconductor material, in the region of the wafer surface, is influenced by heat. Consequently, in particular the service life of the charge carrier as an important quantity relating to the function of the solar cell is influenced. By removing the zones at the wafer surface, which zones are influenced by heat, any impairment to the solar cell, which impairment is caused by heat from laser irradiation, is avoided.

Preferably, the etching step for removing the zone influenced by heat is designed such that in the region of the indentations the wafer surface is etched at a higher etching rate than outside it. In this way the shaping of the indentations in the wafer surface can be further reinforced.

It is advantageous if the etching step is carried out as wet chemical polishing or as a dry etching step, in particular as a plasma etching process. In this context, processing methods which are, for example, known from microsystem technology can be used for controlled processing of the wafer surface.

A particularly advantageous variant of the production method provides for the etching step to additionally cause texturing of the wafer surface comprising the marking. As a result of the combination of texturing with removal of the zones influenced by heat the production process can be applied more economically.

Preferred exemplary embodiments of the method are characterised in that the at least one indentation is produced by laser removal at a depth of more than 8 μm, preferably more than 12 μm, particularly preferably at between 15 and 30 μm.

In conjunction with the above-mentioned parameters relating to the depth of the indentations it is advantageous if the size ratio of depth to diameter of the at least one indentation in the production of the indentation is greater than 1:12, preferably greater than 1:10, and particularly preferably is in the region of 1:7 to 1:3. In the case of indentations that do not comprise a round contour, the characteristic of the diameter in the context of the present invention refers to the smallest space dimension of opposite margin regions of the indentation. The above-mentioned size relationships ensure that the marking can be reliably read out with presently common reading devices for markings, for example with opto-electronic scanners for optical character recognition (OCR), during and after passing through all the process steps in the production of semiconductor-wafer solar cells.

A further important aspect is the spacing of the individual indentations relative to each other if a multitude of indentations are used for forming the marking. Along the minimum distance of second, adjacent, indentations there is usually a web that separates the two indentations from each other. The contrast required during readout of the marking requires adequate web width. Adjacent indentations should be produced with a minimum space of approximately 20 to 30 µm. In this arrangement it should be taken into account that the space between the indentations will be further reduced as a result of an isotropic etching step for removing the zones influenced by laser radiation. On the other hand if the etching step is anisotropic, then the distance between two indentations remains essentially the same.

A preferred solar-cell marking method provides for the solar-cell manufacturing process to comprise the following steps: generating a large-area p-n junction on the wafer surface that comprises the marking, for example by thermal diffusion with a doping agent, in particular with phosphorous; depositing an antireflection coating on the wafer surface comprising the marking, for example in the form of a thin film comprising silicon nitride or titanium dioxide; and applying, drying and baking a metal-containing paste in the form of a metallic electrode grid or front grid, which comprises conducting paths, on the wafer surface with the active zone, which wafer surface comprises the marking. It is clear that designs of the p-n junction or of the production of the front grid, which designs differ from those set out above, are achievable. For example, a multitude of p-n junctions can be formed on a semiconductor wafer, or the front grid instead of being made in the screen printing method can be achieved by layer depositing with subsequent layer structuring.

In the above-mentioned methods it is preferred if the conducting paths are arranged at a distance from the marking. This prevents the electrical conductivity of the conducting paths from being impaired, during their production, due to the indentations present at the wafer surface.

As far as the conducting paths are concerned, a further advantageous variant of the method provides for the conducting paths to be arranged so as to be equidistant from each other.

As far as the arrangement of the conducting paths is concerned, a further variant of the marking method provides for the marking to be arranged in the middle on the semiconductor wafer, and for the conducting paths to be arranged such that a first middle conducting path extends from one side of the wafer surface towards the marking, while a second middle conducting path extends from the opposite side of the wafer surface towards the marking, wherein the first middle conducting path and the second middle conducting path, before establishing contact with the marking, kink off in opposite directions and lead into respective adjacent conducting paths.

In this way the markings can be positioned in the active zone of the solar cells whose dimensions are wider than the maximum distance between two adjacent conducting paths.

Preferably, the marking is constructed from a multitude of indentations such that the marking is designed in the form of a data matrix code or a bar code. In principle, the indentation can comprise any desired shape, for example they can be point-shaped or line-shaped. In this manner it is possible to use marking systems for semiconductor-wafer solar cells, which marking systems have proven reliable in practical experience. Preferably, the marking is produced as a 14×14 data matrix code with an edge length of essentially 2 mm×2 mm.

As an alternative or cumulatively, the marking is produced as a serial identification that can be read by means of an OCR process and that comprises a multitude of characters comprising digits and/or letters, wherein the characters are approximately one millimeter in height.

A preferred variant of the marking method is characterised in that a multitude of markings are produced on the wafer surface. In this way the semiconductor wafer can, for example, be provided with various types of information at various process stages.

The object of the present invention is furthermore met by a solar cell comprising the characteristics of claim 17.

The invention provides for the solar cell to be made from a semiconductor wafer with a wafer surface, and for the marking to be situated in the wafer surface in the region of the active zone of the solar cell.

Because the solar cell is constructed from a semiconductor wafer as a substrate, the active zone of the solar cell, which active zone has been produced on the substrate surface, can be maximised to just in front of the margin of the substrate. The process steps in the production of semiconductor-wafer solar cells, which process steps differ from those of thin-film solar modules, make it possible to position a marking in the active zone of the solar cell, wherein the marking is made in the form of at least one indentation in the wafer surface, which indentation is produced by means of laser irradiation.

The solar cell preferably comprises at least one indentation of such depth that the marking formed by said indentation remains readable by means of an opto-electronic reading device even after the entire solar-cell manufacturing process has been carried out. In this way the entire manufacturing process of a semiconductor-wafer solar cell can be tracked with one and the same indentation. The process steps during manufacture can both apply material to the wafer surface, for example as a deposit of layers, and remove material from the wafer surface, for example in the form of etching processes. Depending on the thickness (layer thicknesses during depositing and etching) and on the isotropy of the material change, and taking into account the requirement of the reading device being used, the depth of the indentations is formed.

The solar cell is preferably designed such that adjoining regions in the interior of the at least one indentation comprise a multicrystalline or a monocrystalline microstructure which is essentially not influenced by laser heat. During the production of the indentations the microstructure of the semiconductor material in the region of the wafer surface is influenced by heat. Consequently, in particular the service life of the charge carrier, as an important quantity relating to the function of the solar cell, is influenced. By removing the zones at the wafer surface, which zones are influenced by heat, the adjoining regions in the interior of the at least one indentation are present as multicrystalline or monocrystaLLine semiconductors that are not influenced by the heat from laser irradiation. In this way the function of the solar cell is not impaired by the heat of the laser irradiation.

A preferred variant of the solar cell provides for the wafer surface in the interior of the at least one indentation to be textured. As a result of this texture the efficiency of the solar cell can be increased in the known manner.

It is advantageous if the solar cell comprises at least one indentation of a depth of more than 8 µm, preferably more than 12 µm, particularly preferably between 15 and 30 µm. In conjunction with the depth of the indentations it is further advantageous for the solar cell if the at least one indentation is designed such that the size ratio of depth to diameter of the at least one indentation is greater than 1:12, preferably greater than 1:10, and particularly preferably is in the region of 1:7 to 1:3. This ensures that the marking can be reliably read out with presently common reading devices for markings, for example with opto-electronic scanners for optical character recognition (OCR), during and after passing through all the process steps in the production of semiconductor-wafer solar cells.

A further important aspect relates to the spacing of the individual indentations from each other if a multitude of indentations for forming the marking are provided. Along the minimum distance of second adjacent indentations there is usually a web that separates the two indentations from each other. The contrast required during readout of the marking requires adequate web width. Adjacent indentations should be produced with a minimum space of approximately 20 to 30 µm A preferred embodiment of the solar cell comprises a large-area p-n junction on the side of the face of the semiconductor wafer, which face faces the marking; an antireflection coating on the wafer surface that comprises the marking; and a metallic electrode grid or front grid that comprises a multitude of conducting paths on the wafer surface comprising the marking with the active zone, wherein the conducting paths extend at a distance from the marking. Of course, in particular in relation to the design and positioning of the p-n junction on the semiconductor wafer a multitude of further variants exist that are not further described in this document.

One example comprises a single solar cell with a marking in the form of a data matrix code arranged centrically on the front in the active zone of the solar cell. The front grid of the cell would then be designed such that the conducting paths of the front grid, which conducting paths extend in the middle region of the solar cell, lead around the data matrix code marking.

A variant of the above-described preferred exemplary embodiment of the solar cell provides for the marking to be arranged in the middle on the semiconductor wafer, and for the conducting paths to be arranged such that a first middle conducting path extends from one side of the wafer surface towards the marking, while a second middle conducting path extends from the opposite side of the wafer surface towards the marking, wherein the first middle conducting path and the second middle conducting path, before establishing contact with the marking, kink off in opposite directions and lead into respective adjacent conducting paths. In this way it is also possible to provide markings in the active zone of the solar cells whose dimensions are wider than the maximum distance between two adjacent conducting paths.

The marking of the solar cell is preferably designed from a multitude of indentations and is designed in the form of a serial identification of a data matrix code or of a barcode. Consequently, different marking systems that are known from prior art, and that have particular advantages and disadvantages, can be implemented for use on a semiconductor-wafer solar cell.

An advantageous variant of the solar cell provides for the marking to be designed as a 14×14 data matrix code with an edge length of essentially 2 mm×2 mm. As an alternative or cumulatively, the marking is produced as a serial code that can be read out by means of an electro-optical reading device, which serial code comprises a multitude of characters comprising digits and/or letters, wherein the characters are approximately one millimeter in height.

A further variant of the solar cell is designed with a multitude of markings on the wafer surface. In this way various marking systems with their respective advantages and disadvantages relating to a semiconductor-wafer solar cell can be combined.

Furthermore, by way of dimensioning of the markings, it is possible to take into account the fact that the time required for marking and reading the markings should not reduce the throughput in the production of the solar cells. As far as its production and readout is concerned, the marking should be designed to suit a cycle time of an in-line production plant for solar cells, which cycle time is typically 1.5 s. This applies both to the solar-cell marking method and to the solar cell comprising the marking.

Below, the present invention is explained in more detail with the use of exemplary embodiments and with reference to the figures. The following are shown:

FIG. 1 a section of the active zone 5 of a first exemplary embodiment of the solar cell;

FIG. 2 a section of the active zone 5, which section is enlarged when compared to that of FIG. 1, of a second embodiment of the solar cell;

FIG. 3a a diagrammatic section view (not to scale) of three indentations 21, arranged adjacent to each other, on the surface of a stilt untreated semiconductor wafer:

FIG. 3b a view of the three adjacent indentations 21 from FIG. 3a after an etching step;

FIG. 3c a view of the adjacent indentations 21 from FIG. 3b after the step of diffusing-in a doping agent to form a p-n junction;

FIG. 3d a diagrammatic section view (not to scale) of three adjacent indentations 21 from FIG. 2 along the section line IIId-IIId; and FIG. 4 a diagrammatic view of method-related steps in the production of solar cells according to the illustrations in FIGS. 1 to 3d.

FIG. 1 shows a section of the active zone 5 of a solar cell 1. The solar cell 1 comprises a data-matrix code marking 2 arranged in the active zone 5 on the wafer surface, which data-matrix code marking 2 comprises individual indentations 21. The solar cell 1 was produced from a multicrystalline or monocrystalline silicon wafer in which already before the actual processing for the manufacture of the solar cell 1 the indentations 21 were produced by means of laser removal. The data-matrix code marking 2 comprises a multitude of adjacent indentations 21, each being in the form of a point and being arranged in a two-dimensional periodically constructed matrix structure. In this arrangement the individual indentations 21 represent individual segments or information units of a data-matrix code.

In addition, underneath the data-matrix code marking 2, a marking in the form of a serial identification 3 produced in the wafer surface of the solar cell 1 is provided. The serial identification 3 is also arranged in the region of the active zone 5 of the solar cell 1. In the present case the serial identification 3 is formed by a combination of indentations 31 in the form of digits. However, it is also imaginable to use any desired combination of digits and letters in any desired language or languages. The indentations 31 that form the serial identification 3 have been produced by means of Laser removal in the raw silicon wafer prior to the actual process for producing the solar cell 1 at a position situated in the active zone 5 of the still-to-be-formed solar cell 1, as is the case with the indentations 21 of the data-matrix code marking 2. The serial identification 3 comprises a sequence of indentations 31, arranged so as to be adjacent to each other, which indentations 31 in each case have the shape of a digit. These indentations 31 are preferably designed such that they can be automatically read out, for example by means of an electro-optically acting OCR reading device. Generally speaking such OCR markings can comprise sequences of any desired characters, e.g. letters or digits, which can be readable by a person or can be machine-readable.

In its active zone 5 the solar cell 1 further comprises conducting paths 4, 4a, 4b, 41a, 41b. These conducting paths 4, 4a, 4b, 41a, 41b that are arranged so as to be essentially equidistant to each other and so as to extend parallel to each other are used for contacting the solar cell 1, thus forming a so-called front grid electrode. In the exemplary embodiment of FIG. 1 the conducting paths 4, 4a, 4b, 41a, 41b are arranged in the region of the data-matrix code marking 2 so that they are adequately spaced apart from the marking 2. In the present case the data-matrix code marking 2 is arranged in the middle of the solar cell 1 in its active zone 5 and covers a surface of approximately 2×2 mm^2. In the middle through the active zone 5 of the solar cell 1 two conducting paths 41a and 41b extend towards the data-matrix code marking 2 and in front of the data-matrix code marking 2 kink downwards or opposite to it upwards in order to lead into the respective adjacent conducting paths 4a, 4b. In this way adequate distance to the data-matrix code marking 2 can be observed even if the dimensions of a marking 2, 3 were to extend beyond the distance of two adjacent conducting paths 4.

FIG. 2 shows a section of the active zone 5, which section is enlarged when compared to that of FIG. 1, of a second embodiment of a solar cell 1 with a data-matrix code marking 2 and a serial identification 3 that is also designed as an OCR marking, wherein the markings 2, 3 are arranged in the middle between two adjacent conducting paths 4. The data-matrix code marking 2 comprises a multitude of point-shaped indentations 21 that have been formed in the active zone 5 on the wafer surface of the solar cell 1 and that together form the marking 2 in the form of the data matrix code. The serial identification 3 comprises individual indentations 31, designed as digits, each of which is formed by a coherent recess in the active zone 5 on the wafer surface of the solar cell 1, which recess comprises a larger surface when compared to the indentations 21 of the data-matrix code marking 2.

Both the data-matrix code marking 2 and the serial identification 3 were formed with the effect of a laser prior to the actual processing of the semiconductor wafer for producing the solar cell 1 in the wafer surface. In principle it is imaginable that forming a marking 2, 3 can also take place at a later point in time during the production process of a solar cell 1. Irrespective of the point in time at which the marking has been made in the production process, the position of the marking 2, 3 in the active zone 5 of the solar cell 1 ensures that even after installation of the solar cell 1 in a solar module said marking 2, 3 is well recognisable and thus easy to read out.

The earlier in the production process of the solar cell 1 the marking is made in the wafer surface, the more important it is to provide adequate depth and an adequate diameter for the indentations 21, 31. This is due to the fact that subsequent process steps, for example etching steps and separation steps, change the depth, the diameter and the optical surface quality of the indentations 21, 31, and thus have an influence on the optical contrast of the marking 2, 3, which optical contrast is essential for reading the marking.

Depending on the concrete design of the process steps the individual point-shaped indentations 21 or the indentations 31 forming the serial identification have been created to be sufficiently deep so as not to be destroyed or overly impaired by the subsequent process steps for producing the solar cell; in other words that they are still readable, in particular machine-readable, for example by way of an opto-electronic reading device for OCR markings.

Preferred dimensions for marking at the beginning of a solar cell production process are explained below in an exemplary manner in relation to the process steps in the production of a solar cell 1, which process steps are shown in FIGS. 3a to 3d.

FIG. 3a shows a diagrammatic section view (not to scale) of three indentations 21, arranged adjacent to each other, on the surface of a still untreated semiconductor wafer. The adjacent indentations 21 are spaced apart from each other by means of webs with a web width S. On the webs the roughness on the wafer surface, which roughness originates from sawing the semiconductor wafers, is shown. In the region of the three indentations 21 the wafer surface is smooth. This is due to the fact that in these regions, during laser ablation, the microstructure of semiconductor material has been altered by heat; however, the semiconductor material has not yet evaporated or directly sublimated. After the laser beam has been switched off, semiconductor material whose microstructure has been altered as a result of heat remains on the wafer surface. In this arrangement, in contrast to the undisturbed crystalline microstructure of the semiconductor wafer a heat-affected zone 11 remains in the indentations. By way of the pulse energy, pulse duration and intensity profile of the laser irradiation and the irradiation duration used, the width W and the depth C of the indentations 21 can be manipulated. By way of these parameters the depth Z of the heat-affected zone 11 is also influenced. In the region of the indentation flanks this depth Z is reduced according to the laterally diminishing pulse intensity.

Since semiconductors whose crystalline microstructure has, for example, been disturbed or has not been disturbed by the heat from laser irradiation comprise different service lives of the charge carriers the physical parameters of a solar cell based on a polycrystalline or monocrystalline semiconductor wafer would be negatively influenced as a result of the heat-affected zone 11. For this reason the heat-affected zones 11 are preferably removed by a subsequent etching step.

FIG. 3b shows the illustration from FIG. 3a after an isotropic etching step, for example wet chemical etching. As a result of concentration, temperature and dwell time of the etching agent a desired etching depth E can be set, and in this way semiconductor material can be removed in a controlled manner. The diagram shows that the etched web width S' when compared to the web width S has been reduced by approximately double the etching depth E, and that the etched deepening width W' correspondingly has increased by double the etching depth E. Due to the isotropic etching behaviour the depth C of the indentations has essentially remained unchanged. Furthermore, for the reasons mentioned above, the etching depth is set such that the heat-affected zones 11 shown in FIG. 3a are completely removed in the region of the indentations 21.

In addition to, or at the same time as, wet chemical polishing it is advantageous to design the etching step such that the wafer surface is given a so-called texture. Such textures are crater-shaped or needle-shaped structures with diameters or spacings in the sub-micrometer or micrometer range and with depths that can comprise several micrometers.

The targeted texture of surfaces and boundary surfaces is generally common and known in the case of solar cells. The fine textures or structures result in multiple reflections of the incident light so that more light is coupled to the cells or light that is coupled-in is "trapped" for longer in the absorption structures. In this way, finally, the efficiency of the solar cells is increased.

FIG. 3c shows the section view from FIG. 3b. To create a p-n junction, a doping agent has been placed into the shown surface of the semiconductor wafer. The doping depth D is, for example, evenly 0.5 µm over the entire surface, wherein phosphorous has been left to thermally diffuse into the surface of a p-conducting semiconductor wafer. In this way an n-conducting doping zone 12 in the form of a thin film is formed.

FIG. 3d finally shows a diagrammatic section view (not to scale) of three adjacent indentations 21 arranged along the section line IIId-IIId from FIG. 2. In contrast to the illustration of FIG. 3c an antireflection coating 13 comprising silicon nitride has been added, which coating has been deposited onto the entire surface of the semiconductor wafer.

Commercially available Nd:YAG laser marking systems are suitable for producing indentations 21. With such systems good results in the marking of semiconductor wafers can be achieved at wavelengths of 1064 nm, pulse durations of 20 to 50 ns and average laser outputs of 5 to 30 W.

If the markings that initially have been made in the region of the future active zone of a solar cell are processed during subsequent process steps, then it is necessary to take into account resulting changes of dimensions and optical surface characteristics with a view to suitability of the processed indentations for reading out markings.

In principle, the high absorption degree, which is inherent in the system, of active zones of solar cells in the case of visible light acts against high-contrast imaging of a marking arranged in the active zone if said marking is illuminated. It has been shown to be necessary to ensure that the indentations are significantly wider than they are deep. At depths of 10 to 30 µm, preferably 20 µm, a diameter of 100 µm prior to a subsequent etching step has been proven to be successful. The etching depth E of the subsequent etching step was 5 µm so that the zones 11 that were morphologically influenced as a result of heat generated by the laser pulses with the above-mentioned parameters have been fully removed.

A further aspect is the distance between the individual indentations 21, 31. The webs which, for example, are shown between the indentations 21 in FIG. 3a with the web width S or with the etched web width S' shown in FIG. 3b are important for the contrast of the marking 2, 3 during read-out. In the case of the above-described variant of adjacent indentations 21 with a round basic shape the web width S should be approximately 30 µm. As a result of the etching step the web is essentially reduced by double the etching depth E so that approximately 20 µm of etched web width remains.

By means of a flow chart, FIG. 4 provides an overview of the entire standard processing for producing a solar cell that in sections has been explained in FIGS. 3a to 3d.

The first step, which takes place at the manufacturer's of the solar cell, comprises a first singling out of the semiconductor wafer at the production handling system A to prepare each wafer for the subsequent process steps. The laser marking of the solar cells to be produced from the wafer takes place prior to singling out (variant A1) or after this first singling out at the production handling system A (variant A2). The associated enlarged view is shown in FIG. 3a. In either case, prior to the first actual process step, namely saw damage etching B, the wafer is marked such that the marking is positioned in the active zone of the solar cell produced in this way.

Saw damage etching B according to the illustration in FIG. 3b can, for example, comprise wet chemical polishing in which material is removed from the wafer front or from the wafer rear. However, as shown above, the laser marking of the solar cell is designed such that it is not destroyed or excessively impaired as a result of the wet-chemical process step. A preferred variant of the method and of the solar cell produced with it provides for the heat-affected zones 11 shown in the indentations 21 in FIG. 3a to be removed by the etching step of saw damage etching B.

Prior to the first actual process step B at the production handling system the marking of a solar cell is read in order to identify the solar cell. If initial read-out takes place immediately after the marking process, then in this way a function check of the laser marking unit is also possible.

The above is followed by the actual processing of the wafer in the process steps C to F. As a result of thermal phosphorous diffusion B, n-doping is produced and on the surface of the p-conducting semiconductor wafer a large-area n-p junction arises (compare FIG. 3c). After the diffusion step B an anti-reflection coating in the form of an SiN coating D is deposited on the wafer surface. On the SiN coating, screen printing E takes place with a metal-containing silver paste, in particular to form the front grid electrode, which is "baked through" by means of thermal treatment in the furnace F through the antireflection coating D right to the contact of the n-doped semiconductor layer. After this process step the production process of the solar cell is completed per se.

For quality control, subsequently the marking is read out anew in the tester G for testing the function of the produced solar cell, as a result of which reliable assignment of the produced solar cell to the data determined by the tester is possible. At the same time any solar cells with unreadable markings can automatically be sorted out. Finally, classification of the solar cell according to clearly defined performance characteristics takes place into various quality classes.

Of course, it is also possible to read out the markings of the individual solar cells during the process, i.e. between two process steps. In this way, simple and complete traceability as well as the ability to document the entire production process are possible.

It should be emphasised that the invention is not limited to the process stated in this document, which is an exemplary process, but that the invention also covers other production processes that make use of the subject of the independent method-related claim.

LIST OF REFERENCE CHARACTERS

1 Solar cell
11 Heat-affected zone
12 Doping zone
13 Antireflection coating
2 Marking as a two-dimensional data matrix code
21 Indentation
3 Marking as an OCR-readable serial identification
31 Indentation
4 Conducting path
4a, 4b Conducting paths that are adjacent to the middle conducting paths 41a, 41b
41a, 41b Middle conducting path
5 Active zone of the solar cell 1

C Depth of the indentations 21
D Diffusion depth of the doping zone 12
S Distance between indentations 21 before the etching step
S' Distance between indentations 21 after the etching step
W Diameter of the indentations 21 before the etching step
W' Diameter of the indentations 21 after the etching step
E Etching depth for the isotropic etching step
Z Depth of the heat-affected zone 11

The invention claimed is:

1. A solar-cell marking method comprising the steps of
providing a substrate with a substrate surface for producing a solar cell that comprises an active zone; and
producing at least one indentation in the substrate surface with the use of laser irradiation, wherein the at least one indentation forms a marking for marking the solar cell, and producing the indentation is carried out prior to carrying out a solar-cell manufacturing process or during carrying out a solar-cell manufacturing process,
wherein the substrate is designed as a semiconductor wafer with a wafer surface, and the marking is positioned on the wafer surface such that the marking is in the active zone of the solar cell formed by the semiconductor wafer.

2. The solar-cell marking method according to claim 1, wherein the at least one indentation is produced at such a depth that as a result of the marking formed by it is readable by means of an opto-electronic reading device even after the entire manufacturing process has been completed.

3. The solar-cell marking method according to claim 1, wherein after producing the at least one indentation an etching step is provided such that the heat-affected zones at the wafer surface are completely removed in the region of the indentation.

4. The solar-cell marking method according to claim 3, wherein the provided etching step is designed such that in the region of the indentations the wafer surface is etched at a higher etching rate than outside it.

5. The solar-cell marking method according to claim 3, wherein the etching step is carried out as wet chemical polishing or as a dry etching step (for example plasma etching).

6. The solar-cell marking method according to claim 5, wherein the etching step additionally causes texturing of the wafer surface comprising the marking.

7. The solar-cell marking method according to claim 1, wherein the at least one indentation is produced by laser removal at a depth of more than 8 µm, preferably more than 12 µm, particularly preferably at between 15 and 30 µm.

8. The solar-cell marking method according to claim 1, wherein the size ratio of depth to diameter of the at least one indentation in the production of the indentation is greater than 1:12, preferably greater than 1:10, and particularly preferably is in the region of 1:7 to 1:3.

9. The solar-cell marking method according to claim 1, wherein the solar-cell manufacturing process comprises the following steps:
generating a large-area p-n junction on the wafer surface that comprises the marking, for example by thermal diffusion with a doping agent, in particular with phosphorous;
depositing an antireflection coating on the wafer surface comprising the marking, for example in the form of a thin film comprising silicon nitride or titanium dioxide; and
applying, drying and baking a metal-containing paste in the form of a metallic electrode grid or front grid, which comprises conducting paths, on the wafer surface that comprises the marking.

10. The solar-cell marking method according to claim 9, wherein the conducting paths are arranged at a distance from the marking.

11. The solar-cell marking method according to claim 10, wherein the conducting paths are arranged so as to be equidistant from each other.

12. The solar-cell marking method according to claim 10, wherein the marking is arranged in the middle on the semiconductor wafer, and the conducting paths are arranged such that a first middle conducting path extends from one side of the wafer surface towards the marking, while a second middle conducting path extends from the opposite side of the wafer surface towards the marking, wherein the first middle conducting path and the second middle conducting path, before establishing contact with the marking, kink off in opposite directions and lead into respective adjacent conducting paths.

13. The solar-cell marking method according to claim 1, wherein the marking is constructed from a multitude of indentations and is designed in the form of a serial identification, of a data matrix code or of a bar code.

14. The solar-cell marking method according to claim 13, wherein the marking is produced as a 14×14 data matrix code with an edge length of essentially 2 mm×2 mm.

15. The solar-cell marking method according to claim 14, wherein the marking is produced as a serial identification that can be read by means of an OCR process and that comprises a multitude of characters comprising digits and/or letters, wherein the characters are approximately one millimeter in height.

16. The solar-cell marking method according to claim 13, wherein a multitude of markings are formed on the wafer surface.

17. A solar cell comprising:
a semiconductor wafer having a photovoltaically active zone and a wafer surface and consisting of multicrystalline or monocrystalline semiconducting material; and
a marking in the semiconducting material in the photovoltaically active zone, the marking comprising an indentation produced by laser removal of a fraction of the multicrystalline or monocrystalline semiconducting material,
wherein interfacial areas of the semiconducting material facing towards the interior of the indentation consist of a multicrystalline microstructure or a monocrystalline microstructure having the effect that the function of the solar cell is not impaired by the marking being positioned in the photovoltaically active zone of the solar cell; and
wherein morphologically-influenced heat-affected zones in the interfacial areas produced by the laser removal are completely removed so that only the multicrystalline microstructure or the monocrystalline microstructure of the semiconducting material remains in the interfacial areas.

18. The solar cell according to claim 17, wherein the indentation is of such depth that the marking remains readable via an opto-electronic reading device even after the entire solar-cell manufacturing process has been carried out.

19. The solar cell according to claim 17, wherein the wafer surface in the interior of the indentation is textured.

20. The solar cell according to claim 17, wherein the indentation comprises a depth of more than 8 µm.

21. The solar cell according to claim 17, wherein the indentation is designed such that the size ratio of depth to diameter of the indentation is greater than 1:12.

22. The solar cell according to claim 17, wherein the wafer surface is on a first side of the semiconductor wafer,
wherein the solar cell further comprises:
a large-area p-n junction on the first side of the semiconductor wafer;
an antireflection coating on the wafer surface and on the marking; and
a metallic electrode grid or front grid that comprises a multitude of conducting paths on the wafer surface comprising the marking, and
wherein the conducting paths extend at a distance from the marking.

23. The solar cell according to claim 22, wherein the marking is arranged in the middle on the semiconductor wafer, and the conducting paths are arranged such that a first middle conducting path extends from one lateral side of the wafer surface towards the marking, while a second middle conducting path extends from the opposite lateral side of the wafer surface towards the marking, and
wherein the first middle conducting path and the second middle conducting path, before establishing contact with the marking, kink off in opposite directions and lead into respective adjacent conducting paths.

24. The solar cell according to claim 17, wherein the marking is constructed from a multitude of indentations and is designed in the form of a serial identification, of a data matrix code or of a bar code.

25. The solar cell according to claim 24, wherein the marking is designed as a 14×14 data matrix code with an edge length of essentially 2 mm×2 mm.

26. The solar cell according to claim 24, wherein the marking is produced as a serial identification that can be read via an electro-optical reading device,
wherein said marking comprises a multitude of characters comprising digits and/or letters, and
wherein the characters are approximately one millimeter in height.

27. The solar cell according to claim 24, wherein a multitude of markings are formed on the wafer surface.

* * * * *